US006603376B1

(12) United States Patent
Handforth et al.

(10) Patent No.: US 6,603,376 B1
(45) Date of Patent: Aug. 5, 2003

(54) SUSPENDED STRIPLINE STRUCTURES TO REDUCE SKIN EFFECT AND DIELECTRIC LOSS TO PROVIDE LOW LOSS TRANSMISSION OF SIGNALS WITH HIGH DATA RATES OR HIGH FREQUENCIES

(75) Inventors: Martin R. Handforth, Kanata (CA); Scott B. Kuntze, Ottawa (CA); Herman Kwong, Kanata (CA)

(73) Assignee: Nortel Networks Limited, Quebec (CA)

( * ) Notice: Subject to any disclaimer, the term of this patent is extended or adjusted under 35 U.S.C. 154(b) by 27 days.

(21) Appl. No.: 09/749,411

(22) Filed: Dec. 28, 2000

(51) Int. Cl.[7] .................................................. H01P 3/08
(52) U.S. Cl. ............................. 333/238; 333/4; 333/5; 333/244; 174/117 AS
(58) Field of Search ......................... 333/1, 4, 5, 238, 333/243, 244, 246; 174/117 AS

(56) References Cited

U.S. PATENT DOCUMENTS

| 4,521,755 A | 6/1985 | Carlson et al. ............ 333/244 |
| 4,614,922 A | 9/1986 | Bauman et al. ............ 333/161 |
| 5,712,607 A | 1/1998 | Dittmer et al. ............ 333/238 |
| 5,724,012 A | * 3/1998 | Teunisse ..................... 333/238 |

FOREIGN PATENT DOCUMENTS

JP 6286905 * 4/1987 ................ 333/238

* cited by examiner

Primary Examiner—Benny Lee
(74) Attorney, Agent, or Firm—Hunton & Williams LLP

(57) ABSTRACT

A technique for improving signal reach and signal integrity when using high bit rates or high signal frequencies is provided. A multi-layer substrate comprises a conductor having a continuous main path and discrete spaced edges protruding from opposing edges of the continuous main path. A first spacer layer is disposed on a first side of the conductor, the first a spacer layer having an air channel substantially coextensive with the continuous main path and a solid portion overlapping with the discrete spaced edges. A second spacer layer is disposed on a second side of the conductor, the second spacer layer having an air channel substantially coextensive with the continuous main path of the conductor and a solid portion overlapping with the discrete spaced edges.

37 Claims, 14 Drawing Sheets

SUSPENDED STRIPLINE STRUCTURES TO REDUCE SKIN EFFECT AND DIELECTRIC LOSS TO PROVIDE LOW LOSS TRANSMISSION OF SIGNALS WITH HIGH DATA RATES OR HIGH FREQUENCIES

CROSS-REFERENCE TO RELATED APPLICATIONS

This patent application is related to U.S. patent application Ser. No. 09/749,435, filed concurrently herewith and entitled "Technology Implementation of Suspended Stripline Within Multi-layer Substrate used to vary time delay and to maximize the reach of signals with High Data Rates or High Frequencies," which is hereby incorporated by reference herein in its entirety.

FIELD OF THE INVENTION

The present invention relates generally to a technique for improving the transmission of high frequency signals within a substrate and, more particularly, to a technique for minimizing losses and skin effect and increasing propagation speed with a particular stripline and dielectric layer configuration.

BACKGROUND OF THE INVENTION

The present state of the art in multi-layer substrates is to sandwich a conventional trapezoidal stripline between two substrate layers, which are generally dielectric layers.

Each substrate layer has an associated loss tangent, which indicates the amount of signal loss due to the dielectric effects of the substrate layers that are adjacent to the stripline. At high data transmission rates, the apparent loss tangent increases, thereby causing more loss. One method for reducing loss proposes reducing the surface area of contact between the substrates and the stripline. U.S. Pat. No. 4,521,755 discloses such a method for reducing the above-described losses by creating a suspended substrate stripline. The patent discloses a cylindrical air channel drilled in a solid block of conductive material in which a dielectric substrate is suspended by diametrically opposing triangular notches carved lengthwise down the channel. The block of conductive material forms the outer or return path conductor. A stripline on the top of the suspended substrate and a matching stripline on the bottom of the suspended substrate are located centrally on the suspended substrate and are connected by periodic conductive vias through the suspended substrate to form the inner conductor. The striplines may have castled edges to increase capacitance between the inner and outer conductors and hence decrease the characteristic impedance of the transmission line.

A major shortcoming of the above-identified solution is the impracticality of constructing such a structure on the small scale required on a printed circuit board (PCB). A further shortcoming is the difficulty of fabricating such a structure in an economically feasible manner. An additional difficulty is that although each stripline sees air on one broad side, each stripline still sees a substrate, which has a higher loss tangent than air, such that the transmission line has more loss than would occur if air could border the transmission line on both sides.

U.S. Pat. No. 5,712,607 discloses a transmission line with an inner conductor similar to that in the above-described patent, incorporated in a multi-layered PCB. Although this incorporation improves the manufacturing process, a notable shortcoming of this configuration is that each half of the stripline still sees a high-loss dielectric substrate on one side and hence signal integrity and signal reach suffer at higher data rates and for longer transmission paths. Furthermore, U.S. Pat. No. 5,712,607 offers no accommodation for differential pairs of striplines in which one line carries the positive polarity of the signal while the other line carries the negative polarity of the signal. These differential configurations are advantageous for noise or common mode rejection.

An additional problem inherent in the prior art results from a phenomenon known as "skin effect". When current is passed through a conductor with a cross-sectional shape as shown in FIG. 13A, current tends toward the outside of the conductor thereby creating a skin as shown in FIG. 13B. The cross-sectional area of the skin is less than the cross-sectional area of the conductor, thereby creating additional losses.

The current distribution within the skin portion ($I_{skin\_depth}$) in FIG. 13B is related to the total current I of the conductor by the equation:

$$I_{skin\ depth} = I/e \qquad (1)$$

where e is the natural constant, which is approximately 2.718.

The skin effect worsens as the frequency of the transmitted signal increases as shown by the following equation:

$$\text{skin\_depth} = 1/\sqrt{(f\pi\sigma\mu)} \qquad (2)$$

where f is equal to signal frequency, $\sigma$ is equal to the conductivity of the transmission medium and $\mu$ is equal to the permeability of the medium. Accordingly, higher data rates lead to smaller skin depth, which in turn leads to higher losses.

Similarly, skin effect is accentuated by corners of a stripline. More current flows in the corners of the stripline than in other portions. The location of the greatest current density is where the largest losses occur, thus resulting in large losses in the corners of a conductor.

In view of the foregoing, it would be desirable to provide a technique for improving signal reach and signal integrity when using high bit rates or high signal frequencies which overcomes the above-described inadequacies and shortcomings. More particularly, it would be desirable to minimize the losses due to non-uniform current distribution and high dielectric constants. Accordingly, it would be desirable to provide a technique for manufacturing a multi-layer substrate for improving signal reach and signal integrity in an efficient and cost effective manner.

SUMMARY OF THE INVENTION

According to the present invention, a technique for improving signal reach and signal integrity when using high bit rates or high signal frequencies is provided. In one embodiment, the technique is realized by providing a multi-layer substrate comprising a conductor, a first spacer layer on a first side of the conductor, the first spacer layer having an air channel substantially coextensive with the conductor, and a second spacer layer on a second side of the conductor, the second spacer layer having an air channel substantially coextensive with the conductor.

In accordance with other aspects of the present invention, a multi-layer substrate is provided that comprises a conductor having a continuous main path and discrete spaced edges protruding substantially perpendicularly from opposing edges of the continuous main path. A first spacer layer is disposed on a first side of the conductor, the first spacer layer having an air channel substantially coextensive with the continuous main path and a solid portion overlapping with the discrete spaced edges. A second spacer layer is provided on a second side of the conductor, the second spacer layer having an air channel substantially coextensive with the continuous main path of the conductor and a solid portion overlapping with the discrete spaced edges.

In accordance with further aspects of the present invention, a conductor is provided within a multi-layer substrate. The conductor comprises a continuous main path having a first elongated edge, a second elongated edge, and a first end and a second end perpendicular to the first and second elongated edges. Additionally, the conductor may comprise a first set of discrete spaced edges protruding the first elongated edge at a first set of locations and a second set of discrete spaced edges protruding from the second elongated edge at a second set of locations. The first set of locations and the second set of locations may be selected such that a width of the conductor is constant over its length.

Alternatively, the first set of distances and the second set of distances can be identical such that the width of the conductor alternates between a minimum and a maximum width.

In accordance with still further aspects of the present invention, a method is provided for constructing a suspended stripline within a multi-layer substrate. The method comprises forming a first substrate with a conductor on one side, etching the conductor into striplines, and applying a second substrate over the etched striplines. The method further comprises forming an air channel in the first substrate and applying a third substrate to the first substrate. The method further comprises forming a channel in the second substrate and applying a fourth substrate to the second substrate.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

In order to correct the above-identified difficulties, two solutions have been implemented in the present invention. First, to minimize loss that occurs due to the properties of the dielectric substrate, a technique has been devised for suspending a stripline in air. Second, to minimize losses due to "skin effect" or non-uniform current distribution, a stripline has been devised that removes outer edges of the stripline from the main stripline path. FIGS. 1–4 more clearly illustrate the first of the above-identified solutions and FIGS. 5A, 5B, 8, and 9 further illustrate the second solution.

Figure 1:
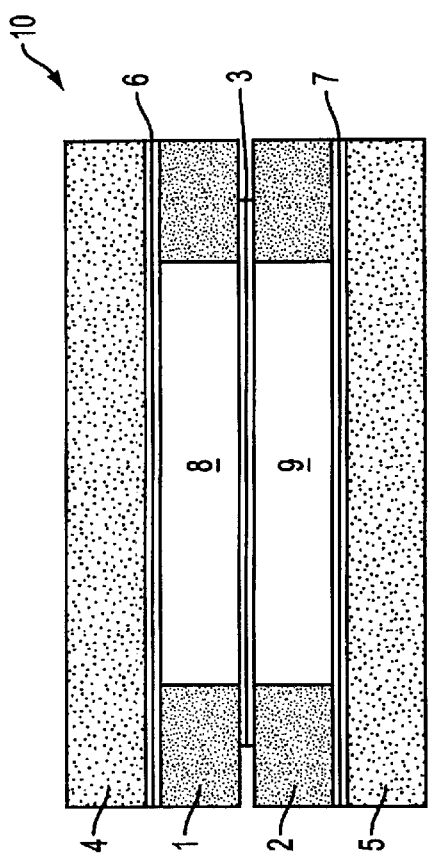
FIG. 1 is a cross-sectional view of a suspended stripline of in accordance with an embodiment of the present invention.

Referring to FIG. 1, there is shown a multi-layer substrate 10 having a suspended stripline 3 in accordance with an aspect of the invention. The stripline 3 is suspended between a first air channel 8 and a second air channel 9. The air channels 8 and 9 are formed in spacer layers 1 and 2 respectively. The spacer layers 1 and 2 may be formed of any known dielectric material. Substrate dielectric layers 4 and 5 are provided on opposite sides of the spacer layers 1 and 2. Optionally, ground planes 6 and 7 are provided between the spacer layers 1 and 2 and the substrate dielectric layers 4 and 5. The substrate dielectric layers 4 and 5 also may be formed of any known dielectric material. Construction of the multi-layer substrate 10 without the ground planes 6 and 7 is also contemplated. The air channels 8 and 9 have a loss tangent of approximately zero which serves to minimize losses throughout the length of the conductor 3. Additionally, the air channels 8 and 9 have provide a low dielectric constant, equal to approximately 1.0, which also helps to minimize losses.

Figure 2:
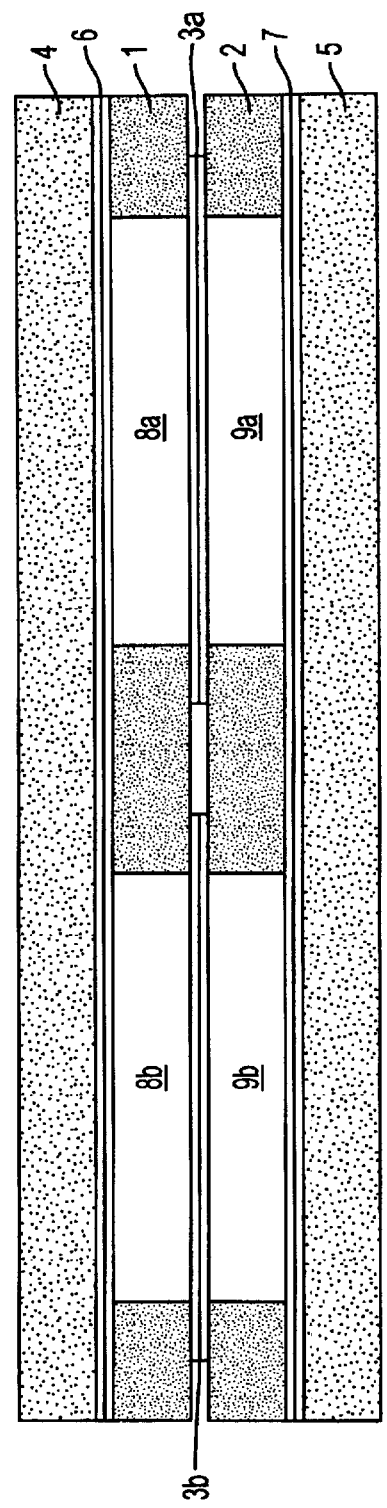
FIG. 2 is a cross-sectional view of an edge coupled differential stripline in accordance with an embodiment of the invention.

Another suspended stripline configuration is the edge-coupled differential stripline shown in FIG. 2 in which like reference numerals refer to like elements earlier described. In the displayed embodiment, the spacer layers 1 and 2 each include two air channels. The spacer layer 1 includes air channels 8a and 8b and the spacer layer 2 includes two air channels 9a and 9b. Edge coupled striplines can be configured to control impedance and provide filtering. Specific configurations are further described below in conjunction with the specific striplines shown in FIGS. 5A and 5B.

Figure 3:
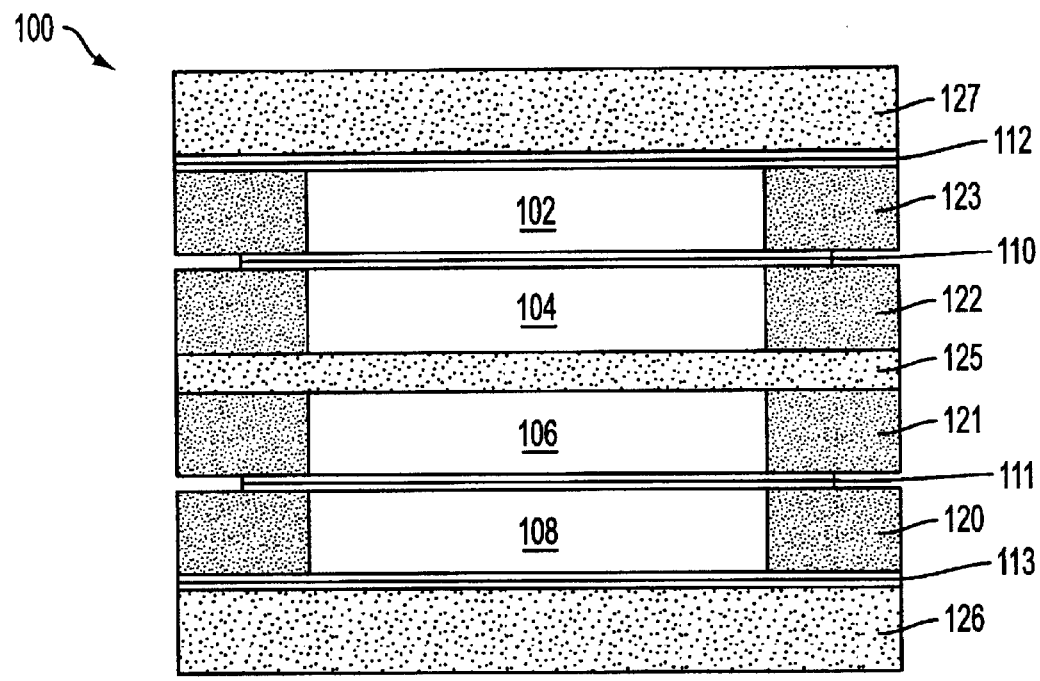
FIG. 3 is a cross-sectional view of a broadside coupled differential stripline in accordance with an embodiment of the invention.
Figure 4:
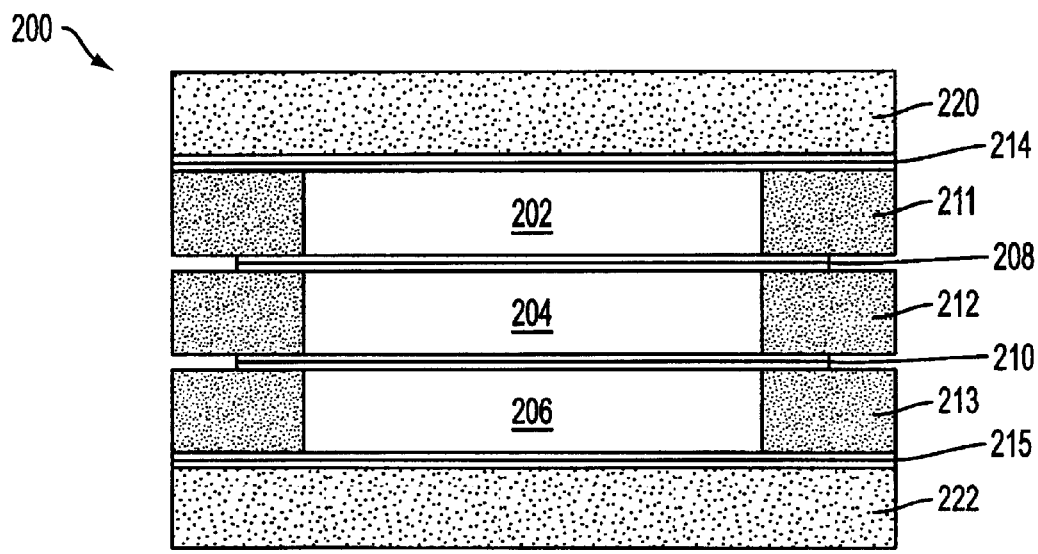
FIG. 4 is a cross-sectional view of a broadside coupled differential stripline in accordance with an embodiment of the invention.

Two additional suspension configurations are shown in FIGS. 3 and 4. FIG. 3 shows a cross-section of a broadside coupled differential stripline with an intermediate substrate 125. The multi-layer substrate 100 includes striplines 110 and 111, which are each suspended between two spacer layers. The stripline 110 is suspended between the spacer layers 122 and 123, in which air channels 104 and 102 are respectively formed. The stripline 111 is suspended between the spacer layers 120 and 121 in which the air channels 108 and 106 are respectively formed. Substrate dielectric layers 126 and 127 form the outermost layers of the multi-layer substrate 100. Ground planes 112 and 113 may optionally be provided.

FIG. 4 displays a broadside coupled differential stripline without a midplane. In this embodiment, a multi-layer substrate 200 comprises three spacer layers 211, 212, and 213, each having an air channel 202, 204, and 206 respectively. A stripline 208 is suspended between the spacer layers 202 and 204 and the air channels 202 and 204. A stripline 210 is suspended between the spacer layers 212 and 213 and the air channels 204 and 206 respectively. Outer dielectric layers 220 and 222 are provided to cover the air channels 202 and 206 respectively. Ground planes 214 and 215 may optionally be provided between the spacer layers 211 and 213 and the outer dielectric layers 220 and 222.

Figure 5A:
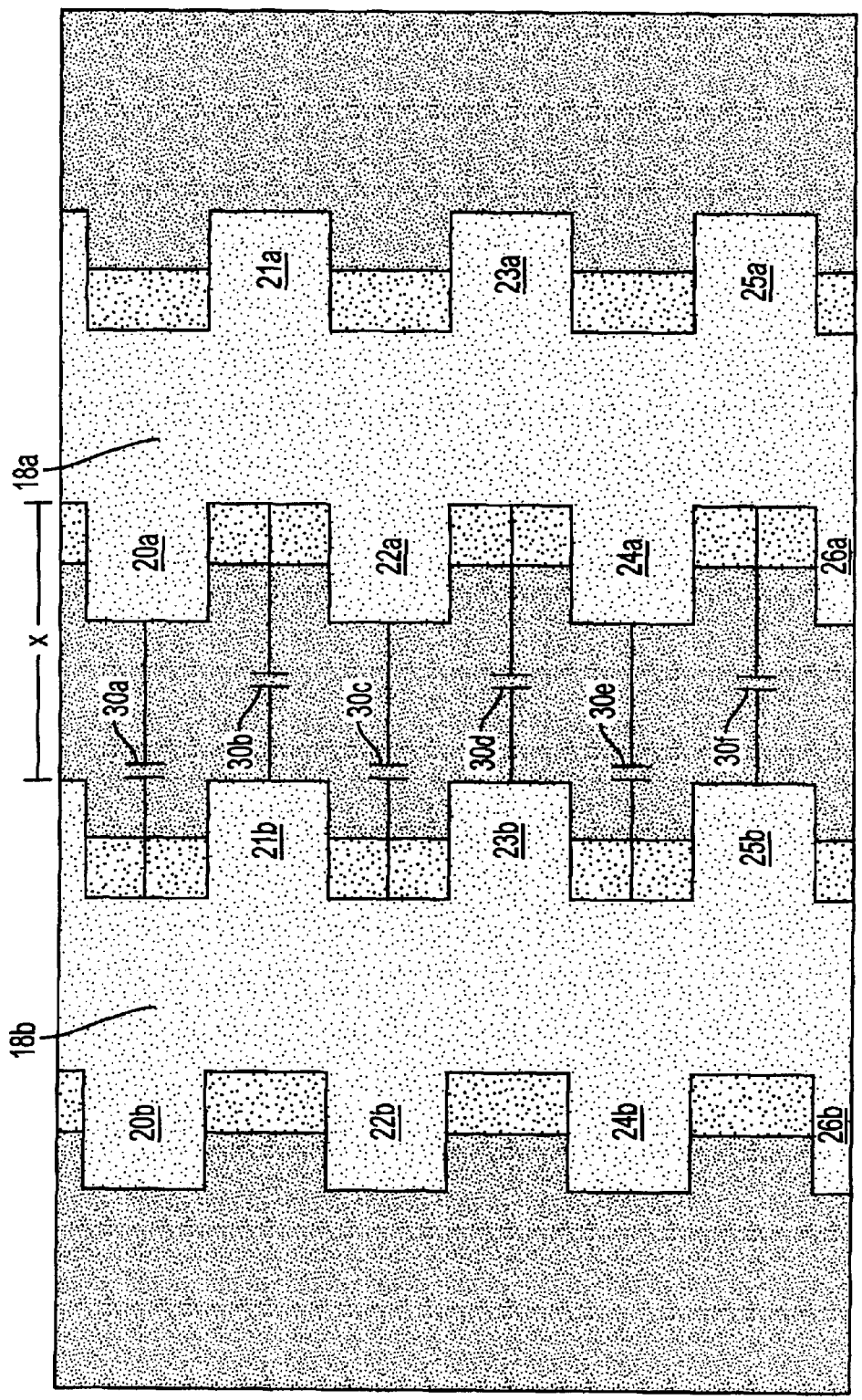
FIGS. 5A and 5B illustrate alternative embodiments of edge coupled differential striplines in accordance with the invention.
Figure 5B:
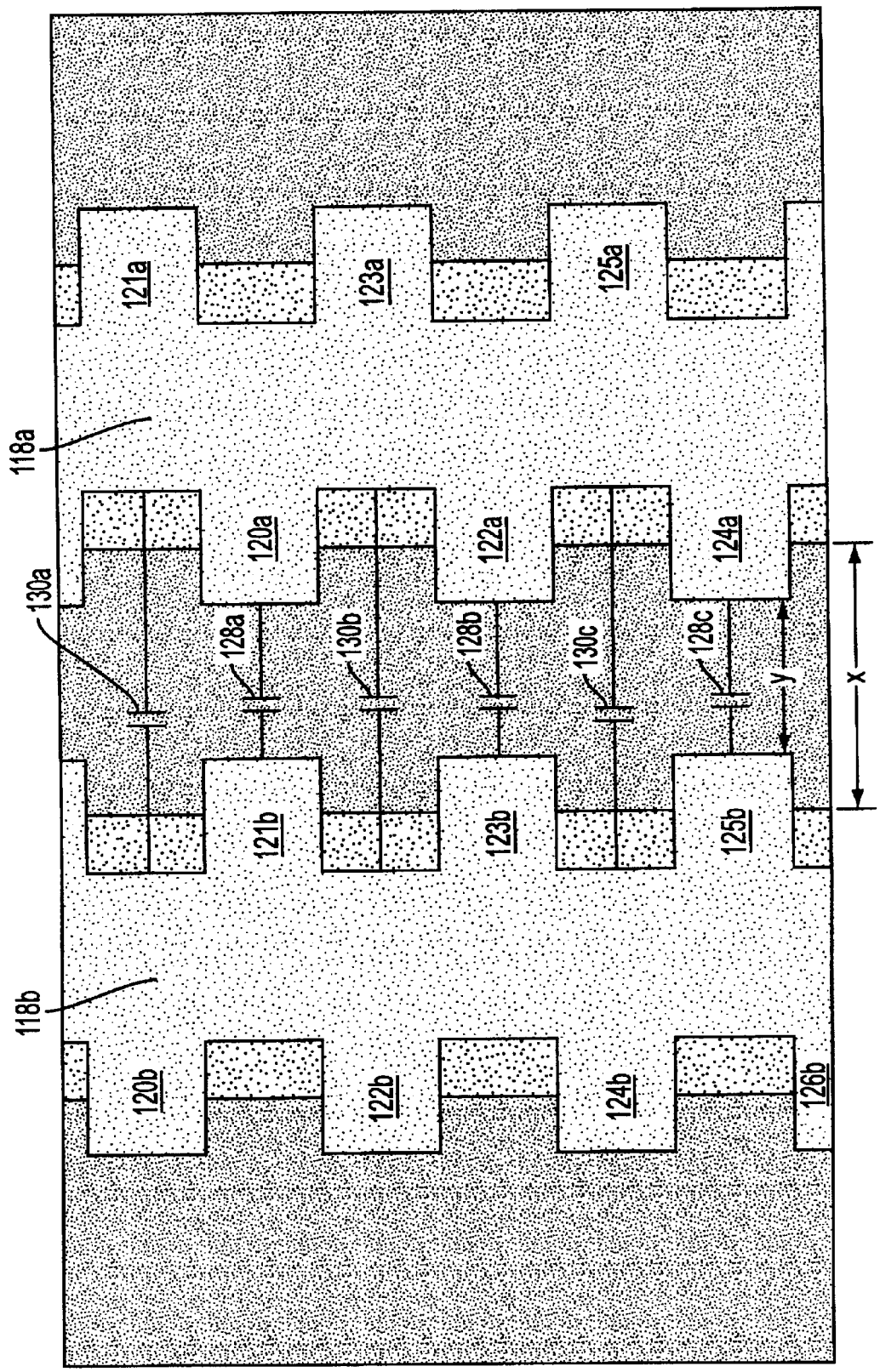

FIGS. 5A and 5B show various embodiments of the edge coupled differential suspended stripline shown in FIG. 2. The displayed configurations include "castled" edges which can be used to control impedance of transmission. Castled edges can be obtained by subtracting or removing the electrical conductor material from the transmission lines of uniform width. This will increase the characteristic impedance of the transmission line, since the capacitance of the conductor will be reduced by the action of decreasing its surface area, and the impedance of the transmission line is inversely proportional to the root of its capacitance:

$$Z=\sqrt{(L/C)} \quad (3)$$

where Z is equal to characteristic impedance, L is equal to inductance, and C is equal to capacitance. With castled edges, an impedance Z' can be created as follows:

$$Z'=\sqrt{(L/(C-\Delta C))} \quad (4)$$

wherein ΔC is the capacitance reduction of the conductor due to the reduction of its surface area. Thus, a higher impedance Z' results. This now permits increasing the width of the conductor in the region between the castled edges in order to restore the characteristic impedance to its original design value. This action results in a lower conductor resistance which lowers the conductor loss. In addition, the presence of the castled edges increases the path length along the conductor edges where the current concentration is high due to skin effect at high frequencies. This suppresses the flow of edge currents and aids in redistributing the current flow over a greater portion of the central conductor region, thereby reducing losses due to skin effect. A further benefit of the castled edges is that a greater portion of the conductor capacitance is formed by an air dielectric as opposed to the solid and potentially lossier dielectric of the supporting structure. Since the dielectric loss of air is virtually zero, a net reduction of the total dielectric loss occurs.

FIG. 5A shows a configuration calculated to control impedance. Striplines 18a and 18b are configured to each have a continuous main path. On the stripline 18a, discrete spaced edges 20a, 22a, 24a, and 26a protrude from one edge of the stripline 18a and discrete spaced edges 21a, 23a, and 25a protrude from an opposite edge of the conductor 18a. The stripline 18b includes a continuous main path. Discrete spaced edges 20b, 22b, 24b, and 26b protrude from a first edge of the conductor 18b and discrete spaced edges 21b, 23b, and 25b protrude from an opposing edge of the conductor 18b. The juxtaposition of the inner edges 20a, 21b, 22a, 23b, 24a, 25b, and 26a create a constant distance x between the striplines in which capacitances 30a–30f are shown. Accordingly, the configuration of FIG. 5A can be referred to as an "even capacitance" configuration.

FIG. 5B illustrates a filter or uneven capacitance configuration. In the configuration of FIG. 5B, striplines 118a and 118b are provided. The stripline 118a includes a continuous main path and discrete spaced edges 120a, 121a, 122a, 123a, 124a, and 125a. The stripline 118b includes a continuous main path and discrete spaced edges 120b, 121b, 122b, 123b, 124b, 125b, and 126b. In this instance, the protruding edges are aligned such that two distinct distances x and y are created between the striplines, thus creating uneven capacitances 128a, 128b, and 128c and 130a, 130b, and 130c.

Figures 6A, 6B:
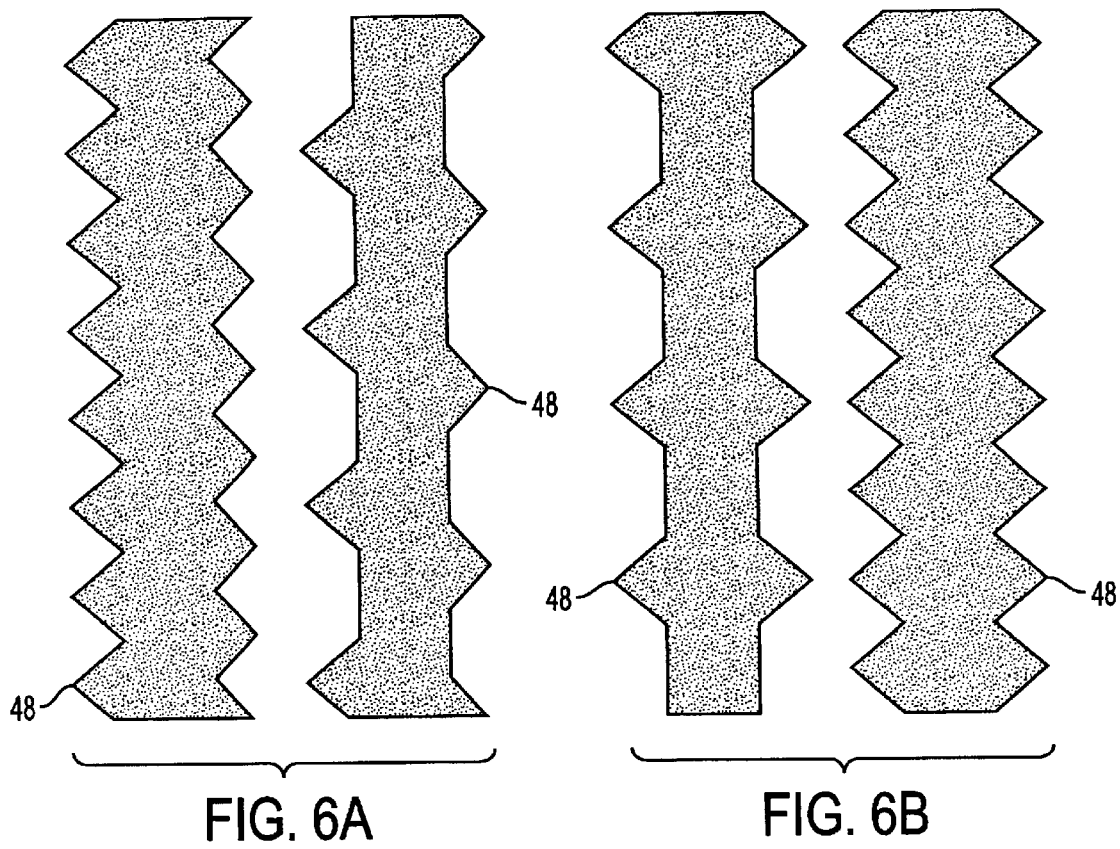
FIGS. 6A, 6B, 6C, 6D, and 6E illustrate edge shapes and alignments in alternative embodiments of the invention.
Figure 6C:
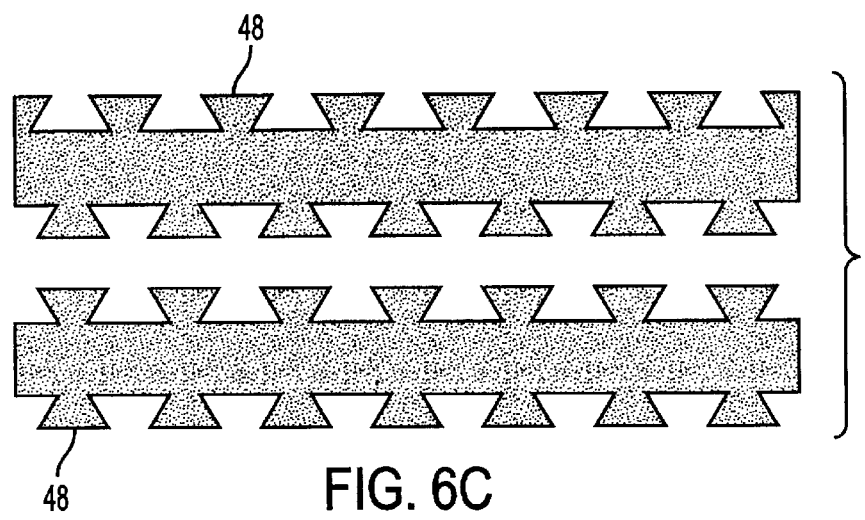
Figure 6D:
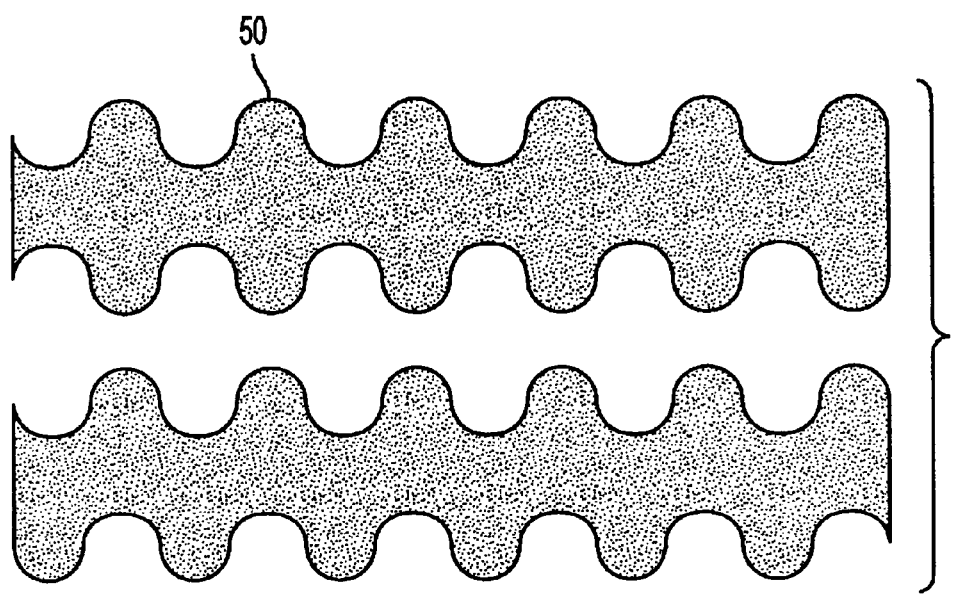
Figure 6E:
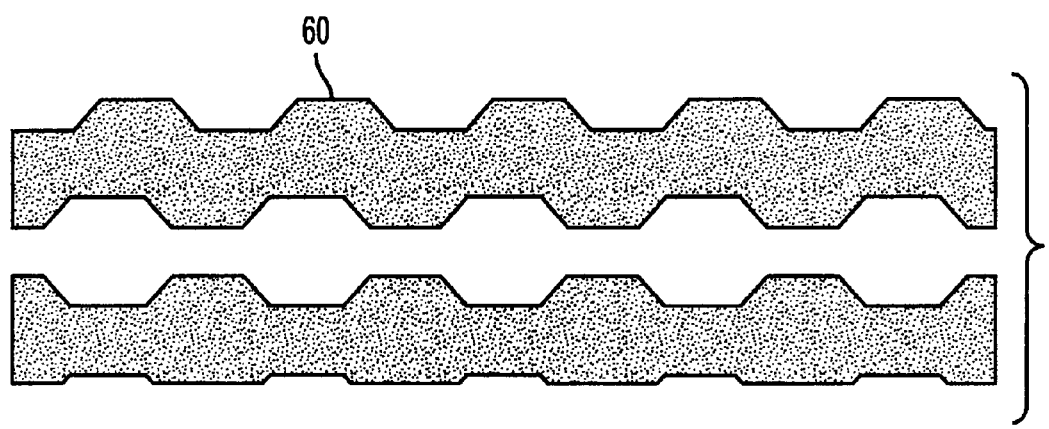

FIGS. 6A–6E illustrate alternative edge configurations. FIGS. 6A–6C illustrate the implementation of triangularly shaped protruding edges 48. FIG. 6D illustrates the use of curved edges 50. FIG. 6E illustrates the use of trapezoidal edges 60. Of all of the aforementioned edge shapes, which include rectangular, triangular, curved, and trapezoidal, the trapezoidal edges have the benefit of ease of manufacture. It should be noted that the protruding edges could be constructed in the form of any shape and should not be limited to those set forth above.

Figure 7A:
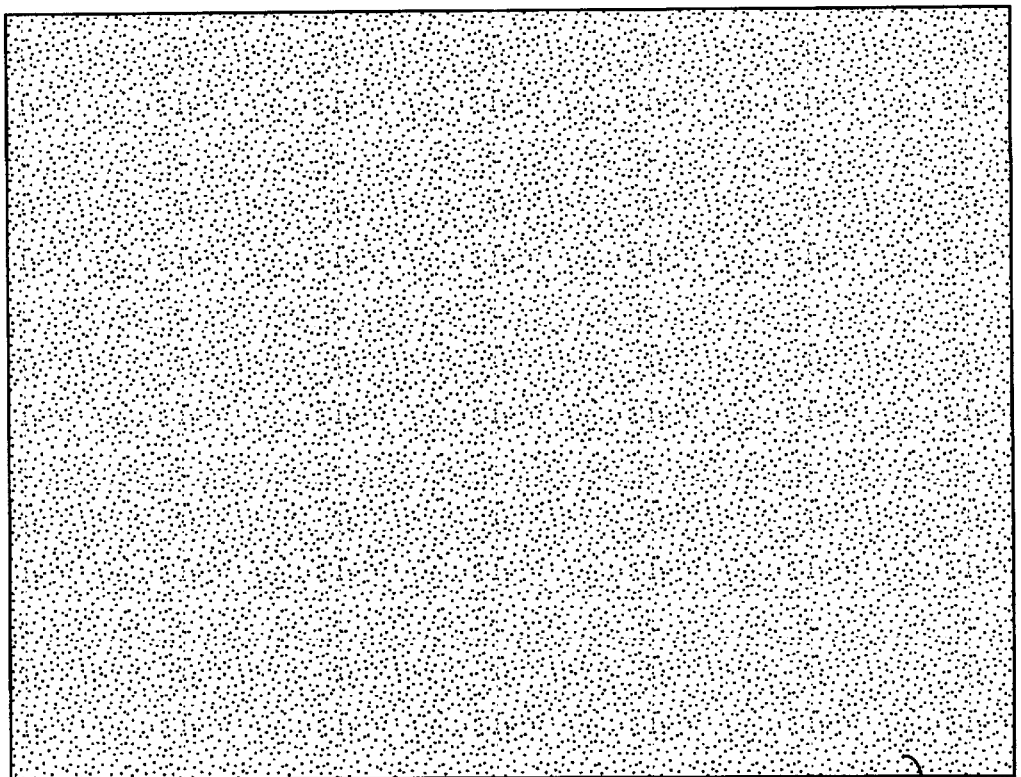
FIGS. 7A, 7B, 7C, and 7D illustrate a plan view, layer by layer (without ground planes), in accordance with an aspect of the invention.
Figure 7B:
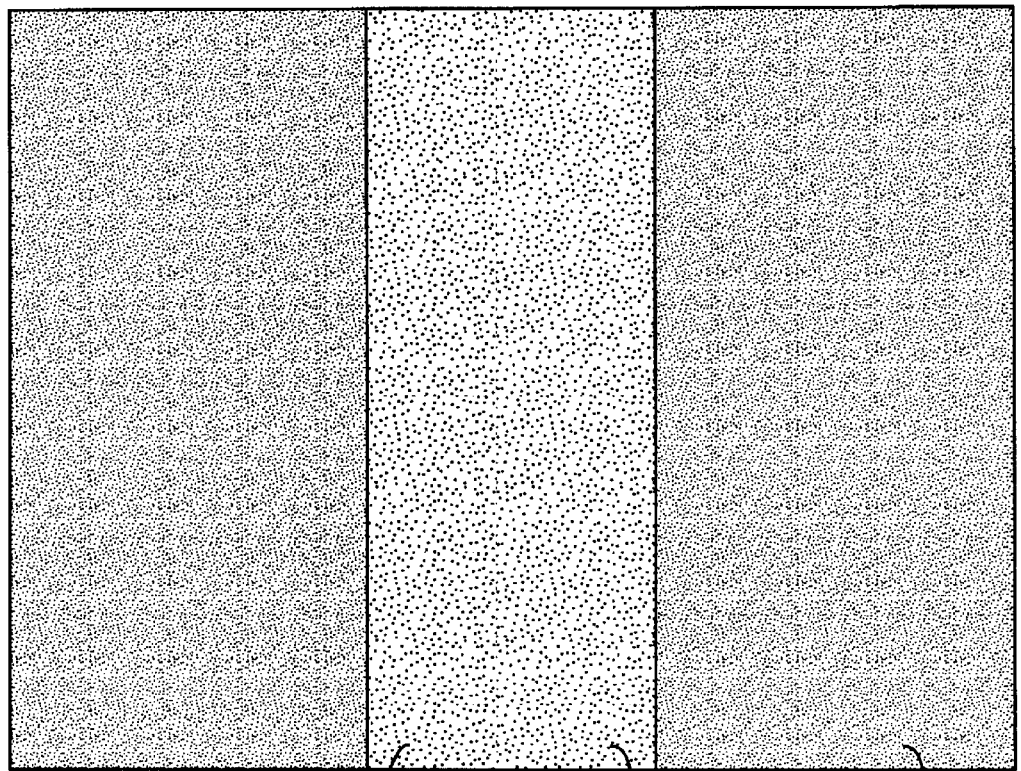
Figure 7C:
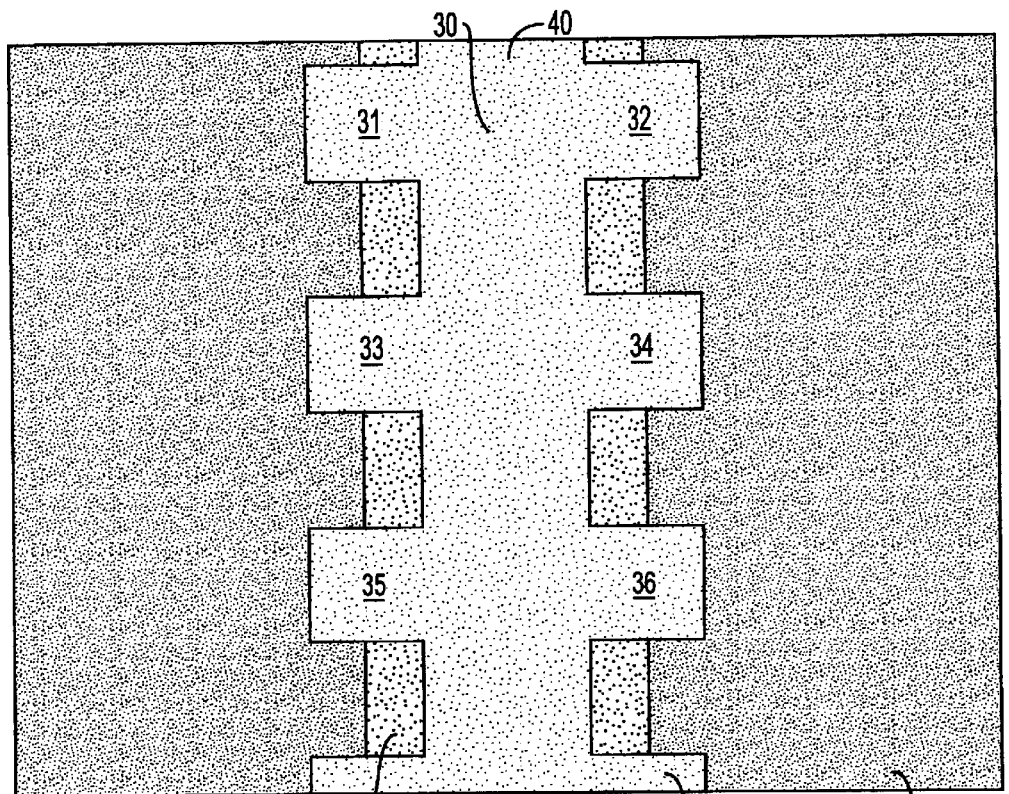
Figure 7D:
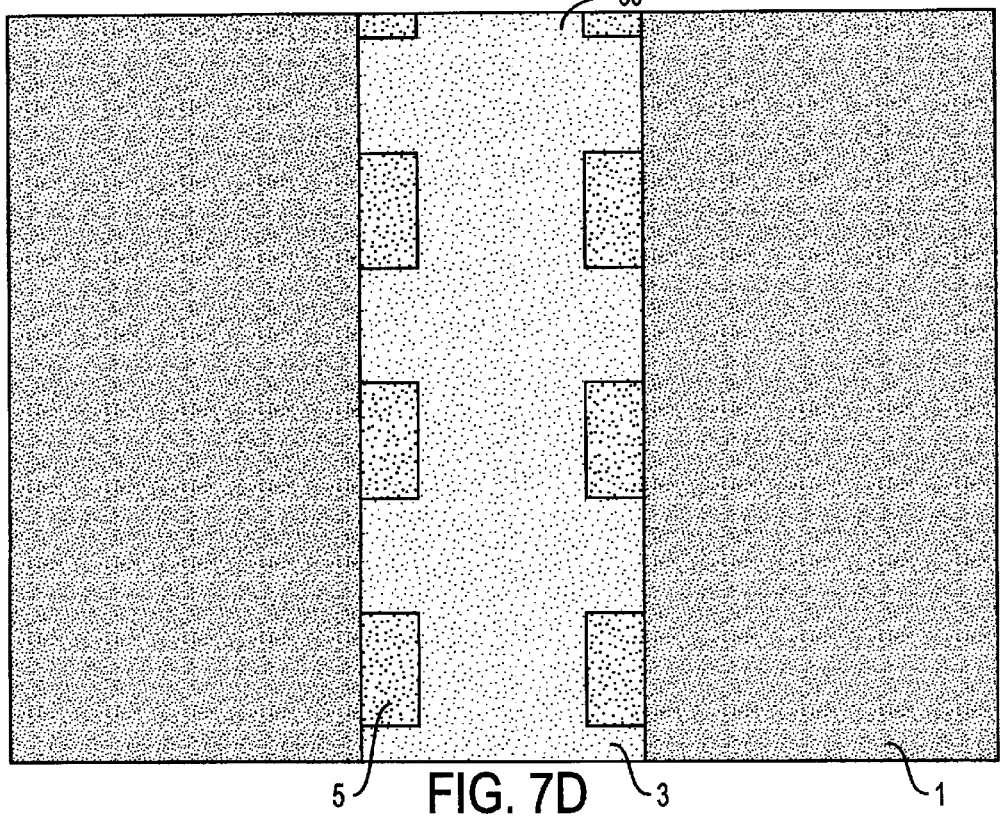

FIGS. 7A–7D are plan views of the multi-layer substrate 10 in various stages of construction. FIG. 7A is a plan view of the bottom substrate dielectric layer 5 shown in FIG. 1. FIG. 7B is a plan view of the multi-layer substrate 10 with the substrate layer 5 and the spacer layer 2 having the air channel 9 formed therein. The ground plane layer 7 is not shown in this embodiment. FIG. 7C shows the substrate layer 5, the suspended stripline 3, and the spacer layer 2, positioned under the suspended stripline 3. In the displayed embodiment, the suspended stripline 3 has a continuous main path 30 and castled edges 31–36. In the displayed embodiment, the castled edges on opposite sides of the main path 30 are located at equidistant points from a first end 40 of the stripline 3. FIG. 7D is a plan view showing the substrate layer 5, the stripline 3 and the spacer layer 1, placed over the stripline 3. As shown, in FIGS. 7C and 7D, the spacer layers 1 and 2 partially cover the castled edges 31, 32, 33, 34, 35, and 36, but do not cover the continuous main path 30.

Figure 8:
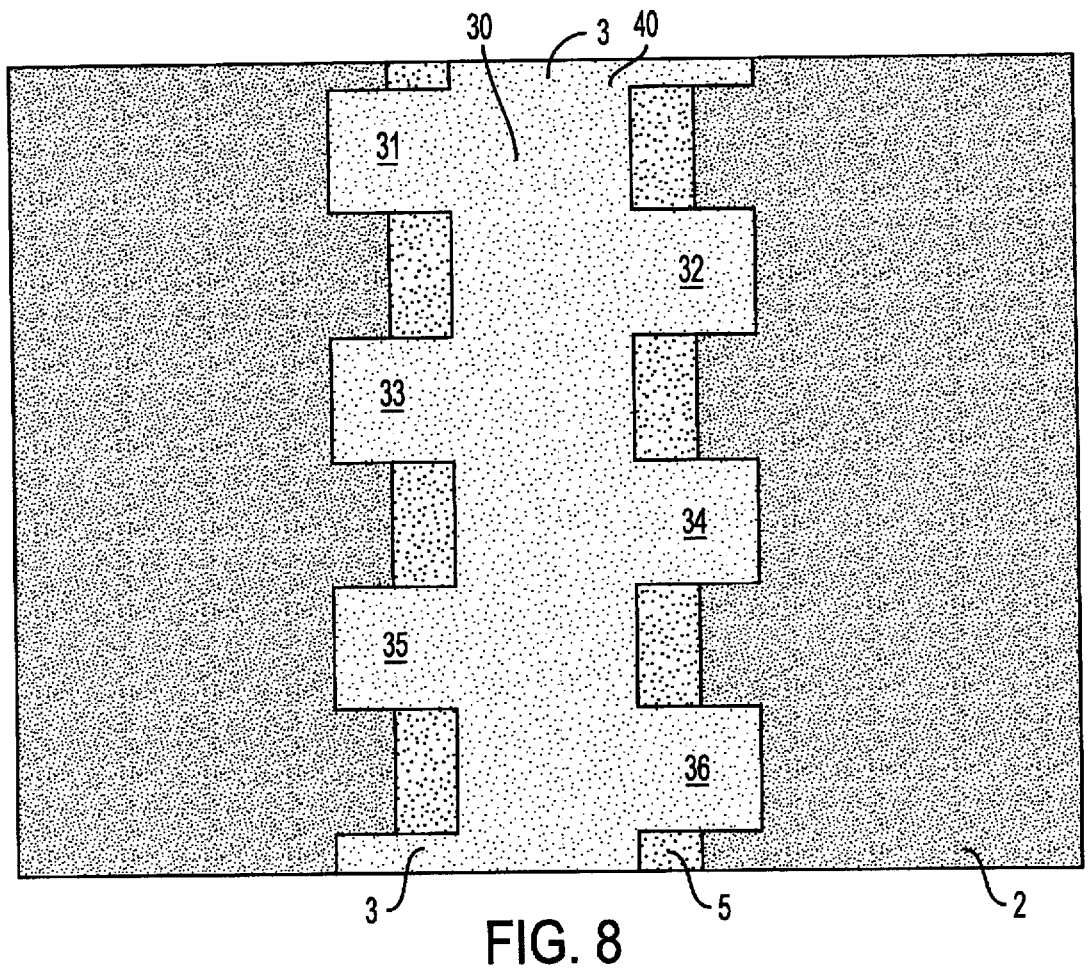
FIG. 8 is a plan view in accordance with a preferred embodiment of the invention.

FIG. 8 illustrates a plan view of a preferred embodiment of the suspended stripline 3. In this embodiment, the substrate layer 5 is shown as the base layer. The spacer layer 2 is positioned above the substrate layer 5 and the stripline 3 is positioned above the spacer layer 2. The stripline 3 has a continuous main path 30 and castled edges 31–36. The castled edges 31–36 are located at set distances from the an edge 40 of the stripline 3. The edges 32, 34, and 36 are located at a first set of distances from the end 40 and the edges 31, 33, and 35 are located at a second set of distances from the edge 40, such that the edges on opposing sides of the main path 30 do not overlap with one another thereby creating constant impedance.

Figure 9:
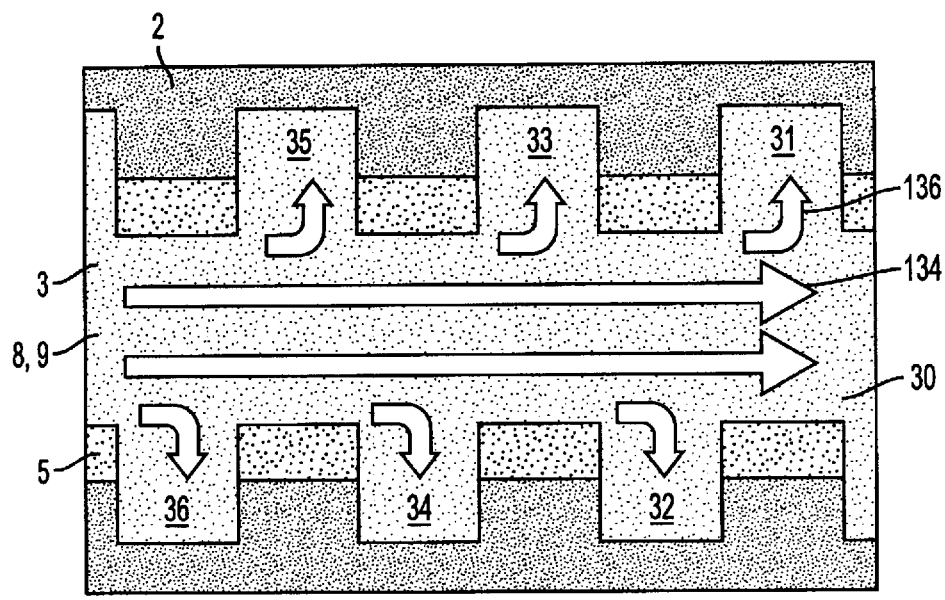
FIG. 9 illustrates current flow in a plan view according to an aspect of the invention.

FIG. 9 shows the practical effect of the configuration shown in FIG. 8. Through current 134 travels through the continuous main path 30. Other current 136 dissipates from the main path 134 through the edges 31–36. Because the edges 31–36 are in contact with the spacer layers 1 and 2 (only spacer layer 2 shown), the edges do not see the air channels 8 and 9, which have a lower dielectric constant. Accordingly, the current 136 dissipates through the edges 31–36 contributes to capacitance and the dielectric loss is restricted to the non-through current 136.

Figure 10:
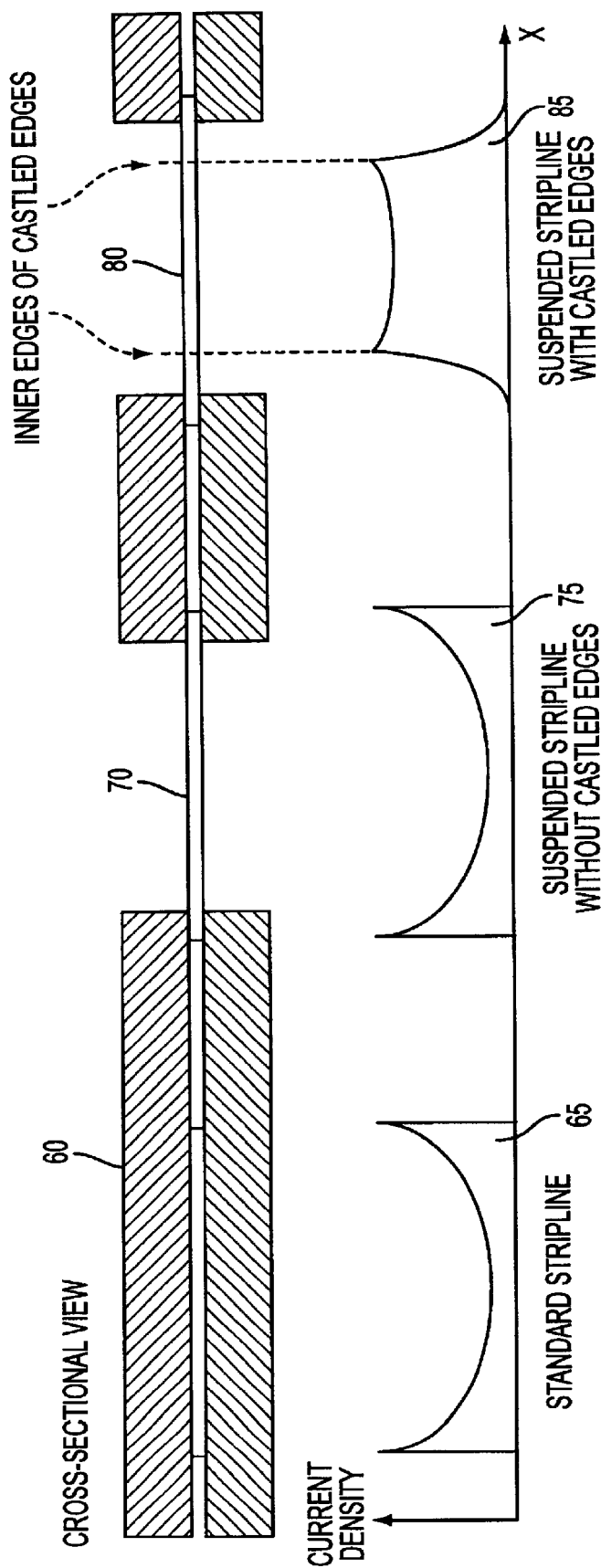
FIG. 10 is a diagram illustrating current density in accordance with related art and embodiments of the invention.

FIG. 10 is a diagram illustrating the theoretically predicted effects of the solutions presented by this invention. A standard stripline 60 is shown in combination with its associated current density 65. A suspended stripline 70 (without castled edges) is shown with its associated current density 75. A suspended stripline with castled edges 80 is shown with its associated current density 85. As is evident, current density 85 in the center of the suspended castled stripline 80 is far more uniform than in the standard stripline 60 and than in the suspended stripline without castled edges 70, hence there is less loss.

Figure 11:
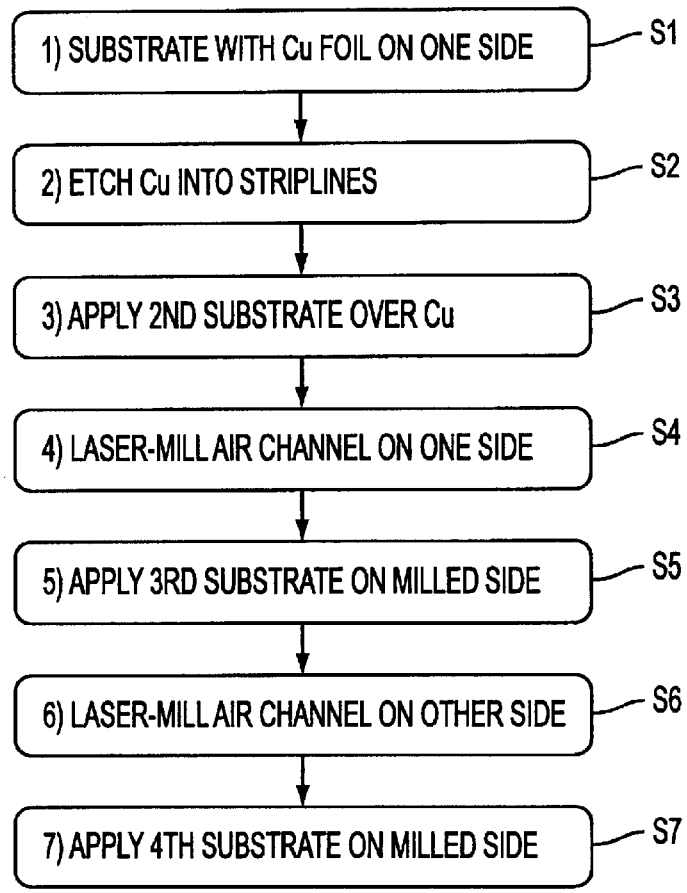
FIG. 11 is a flow chart illustrating a method of constructing a suspended stripline in accordance with an aspect of the invention.

FIG. 11 illustrates a method by which the aforementioned suspended stripline embodiment of FIG. 1 can be constructed. FIGS. 12A–12G show each method step individually.

Figure 12A:
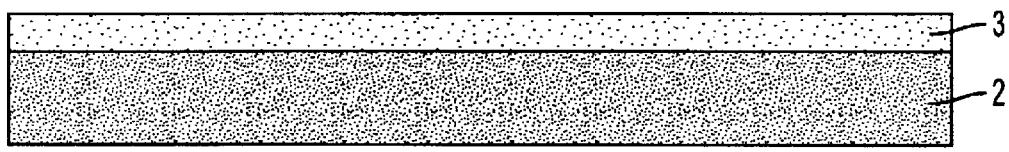
FIGS. 12A, 12B, 12C, 12D, 12E, 12F, and 12G each represent a cross-sectional view of a step in construction of an aspect of the invention.

In step S1 of FIG. 11, a substrate layer having copper foil on one side is produced. Step S1 is shown in FIG. 12A in which a substrate 2 is covered with a copper foil 3.

Figure 12B:
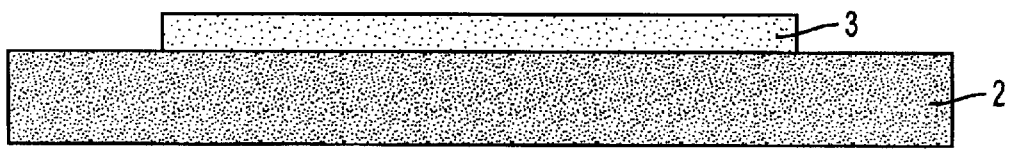

In step S2 of FIG. 11, the copper foil is etched into tracks. This step is shown in FIG. 12B in which the substrate 2 is covered with etched copper foil 3.

Figure 12C:
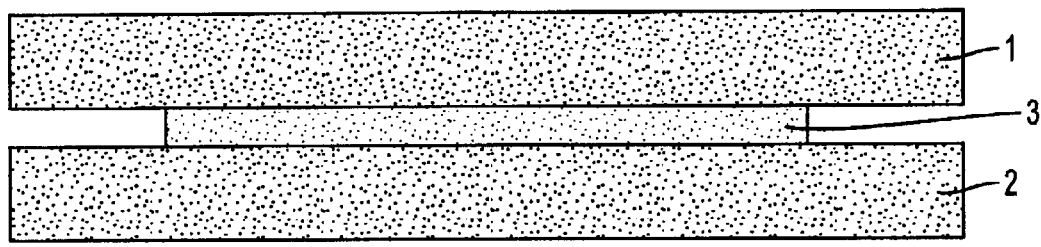

In step S3 of FIG. 11, a second substrate is applied over the copper foil. This step is shown in FIG. 12C in which a substrate 1 is placed upon the etched copper foil 3.

Figure 12D:
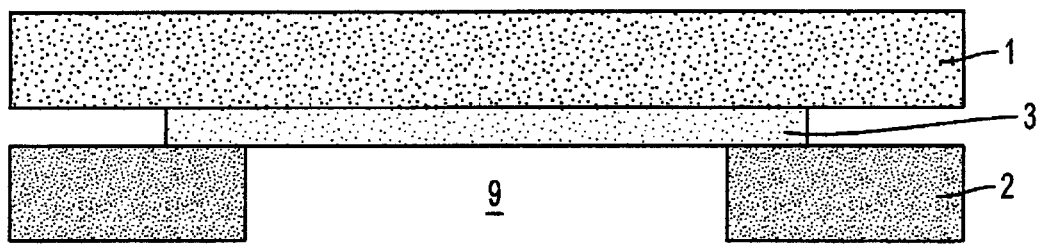

In step S4 of FIG. 11, a channel can be formed by any number of suitable methods including, but not limited to laser ablation and laser milling in one of the substrates. Step S4 is shown in FIG. 12D in which a channel 9 is etched into the substrate 2, thereby exposing the copper foil 3.

Figure 12E:
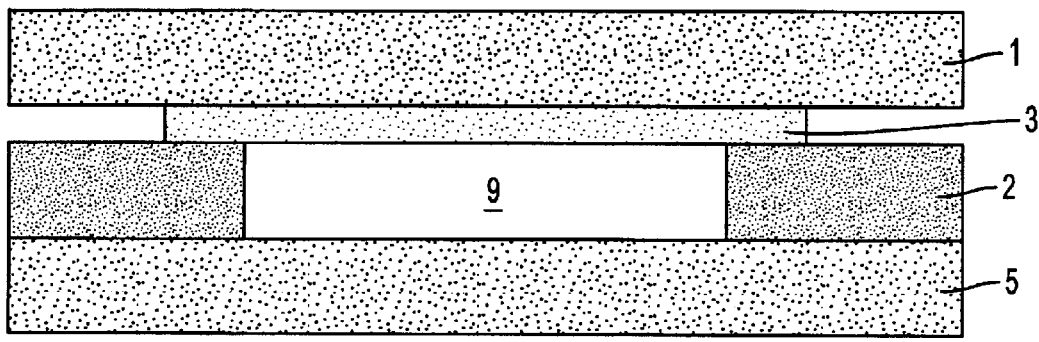

In step S5 of FIG. 11, a third substrate is applied to the substrate having the laser milled channel. Step S5 is shown in FIG. 12E in which a substrate 5 is placed adjacent the substrate 2.

Figure 12F:
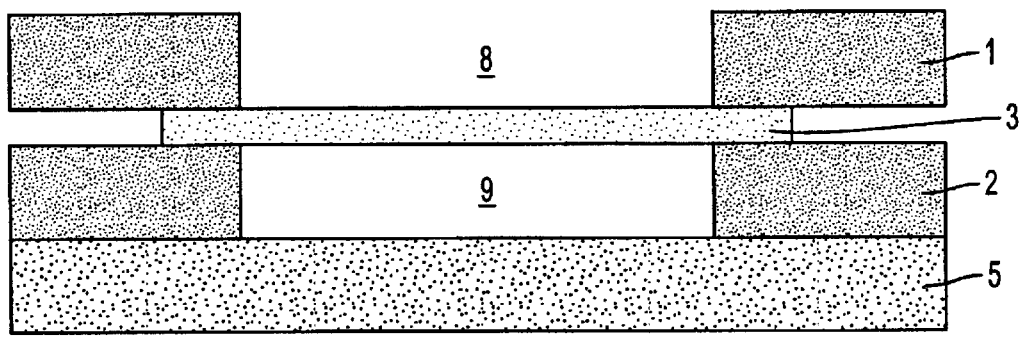

In step S6, a channel is laser milled into the substrate 1 on the opposite side. Step S6 is shown in FIG. 12F in which a channel 8 is formed into the substrate layer 1, thereby exposing the copper tracks 3.

Figure 12G:
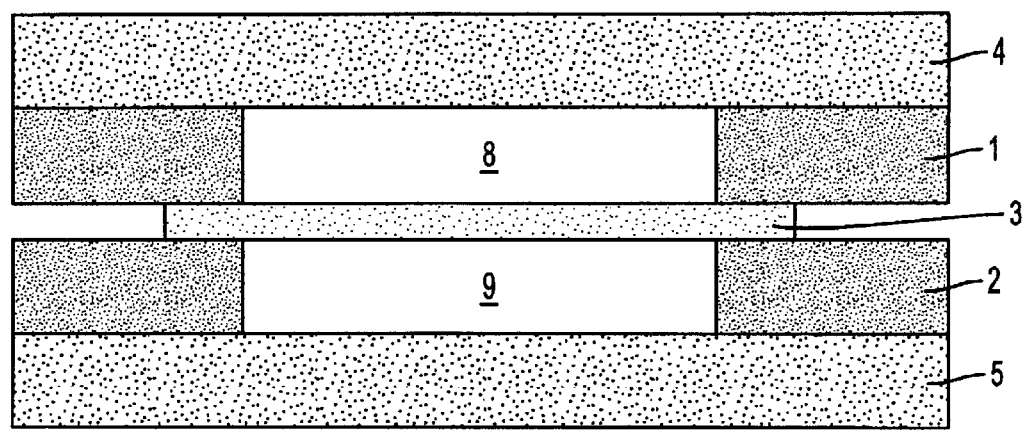
Figure 13B:
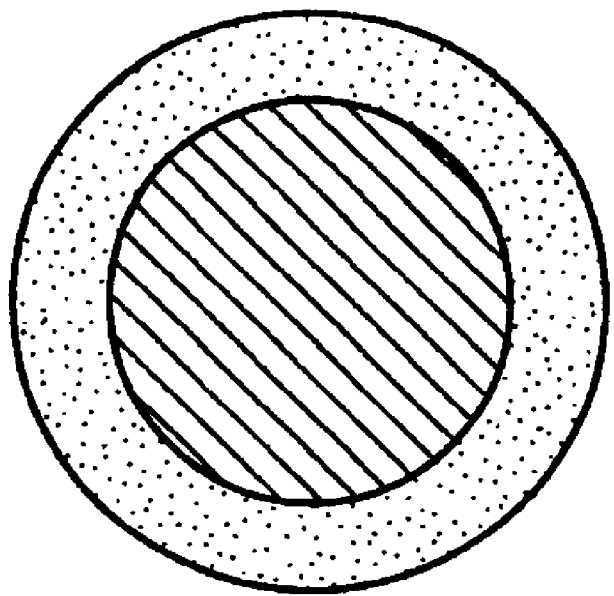
FIGS. 13A and 13B illustrate skin effect difficulties inherent in related art.
Figure 13A:
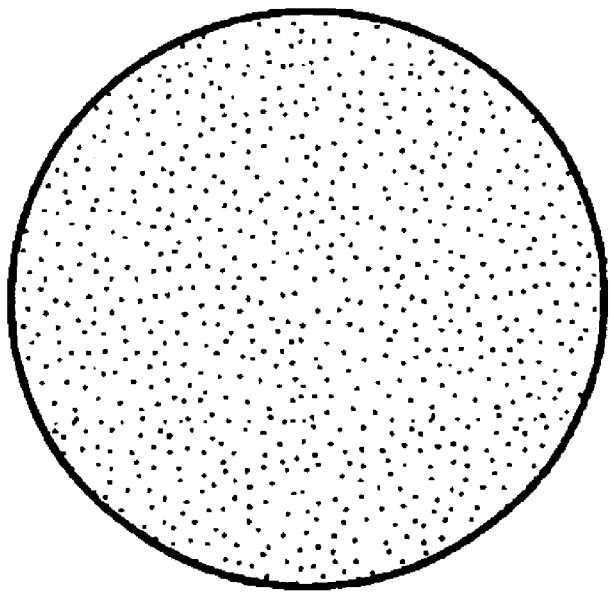

In step S7, a fourth substrate is applied on the side milled in step S6. This step is shown in FIG. 12G in which a substrate 4 is placed adjacent the milled substrate 1 overlying the air channel 8.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A multi-layer substrate comprising:
   a conductor having a continuous main path and discrete spaced edges protruding from opposing edges of the continuous main path;
   a first spacer layer on a first side of the conductor, the first spacer layer having an air channel substantially coextensive with the continuous main path of the conductor; and
   a second spacer layer on a second side of the conductor, the second spacer layer having an air channel substantially coextensive with the continuous main path of the conductor;
   wherein the first spacer layer and the second spacer layer at least partially cover the discrete spaced edges, but do not touch the continuous main path.

2. The multi-layer substrate of claim 1, further comprising a first substrate layer covering the first spacer layer and a second substrate layer covering the second spacer layer.

3. The multi-layer substrate of claim 1, wherein the discrete spaced edges have a shape that is approximately one of triangular, rectangular, trapezoidal, and curved.

4. The multi-layer substrate of claim 1, wherein the conductor has a first end and the discrete spaced edges on one opposing edge are positioned at a first set of distances from the first end and the discrete spaced edges on another opposing edge are positioned at a second set of distances from the first end.

5. The multi-layer substrate of claim 4, wherein the first set of distances and the second set of distances have no common points so that the conductor has a constant width throughout a length thereof.

6. The multi-layer substrate of claim 4, wherein the first set of distances and the second set of distances are identical.

7. The multi-layer substrate of claim 1, further comprising a second conductor, and an additional air channel in each of the first and second spacer layers, wherein the second conductor is positioned so as to be coextensive with the additional air channels.

8. The multi-layer substrate of claim 1, further comprising a second conductor positioned on an opposite side of one of the first and second air channels from the first conductor, and a third spacer layer having a third air channel therein, wherein the third air channel is coextensive with the second conductor.

9. The multi-layer substrate of claim 8, further comprising a first ground layer between the first substrate layer and the first spacer layer.

10. The multi-layer substrate of claim 9, further comprising a second ground layer between the second substrate layer and the second spacer layer.

11. A multi-layer substrate comprising:
    a conductor having a continuous main path and discrete spaced edges protruding from opposing edges of the continuous main path;
    a first spacer layer on a first side of the conductor, the first spacer layer having an air channel substantially coextensive with the continuous main path and a solid portion overlapping with the discrete spaced edges; and
    a second spacer layer on a second side of the conductor, the second spacer layer having an air channel substantially coextensive with the continuous main path of the conductor and a solid portion overlapping with the discrete spaced edges.

12. The multi-layer substrate of claim 11, further comprising a second conductor positioned on an opposite side of one of the first and second air channels from the first conductor, and a third spacer layer having a third air channel therein, wherein the third air channel is coextensive with the second conductor.

13. The multi-layer substrate of claim 11, further comprising a second conductor, and an additional air channel in each of the first and second spacer layers, wherein the second conductor is positioned so as to be coextensive with the additional air channels.

14. The multi-layer substrate of claim 11, wherein the discrete spaced edges protrude substantially perpendicularly from the continuous main path.

15. The multi-layer substrate of claim 11, wherein the discrete spaced edges have a shape that is one of triangular, rectangular, trapezoidal, and curved.

16. The multi-layer substrate of claim 11, wherein the conductor has a first end and the discrete spaced edges on one opposing edge are positioned at a first set of distances from the first end and the discrete spaced edges on another opposing edge are positioned at a second set of distances from the first end.

17. The multi-layer substrate of claim 16, wherein the first set of distances and the second set of distances have no common points so that the conductor has a constant width throughout a length thereof.

18. The multi-layer substrate of claim 16, wherein the first set of distances and the second set of distances are identical.

19. The multi-layer substrate of claim 11, wherein the first spacer layer and the second spacer layer at least partially cover the discrete spaced edges, but do not touch the continuous main path.

20. The multi-layer substrate of claim 11, further comprising a first substrate layer covering the first spacer layer and a second substrate layer covering the second spacer layer.

21. The multi-layer substrate of claim 20, further comprising a first ground layer between the first substrate layer and the first spacer layer.

22. The multi-layer substrate of claim 21, further comprising a second ground layer between the second substrate layer and the second spacer layer.

23. A conductor within a multi-layer substrate, the conductor comprising:
   a continuous main path having a first elongated edge, a second elongated edge, and a first end and a second end perpendicular to the first and second elongated edges;
   a first set of discrete spaced edges protruding from the first elongated edge at a first set of locations; and
   a second set of discrete spaced edges protruding from the second elongated edge at a second set of locations,
   wherein the first set of locations and the second set of locations are selected such that a width of the conductor is constant over a length thereof.

24. The multi-layer substrate of claim 23, wherein the first and second set of discrete spaced edges extend substantially perpendicularly from the continuous main path.

25. The multi-layer substrate of claim 23, wherein the first and second set of discrete spaced edges are rectangular.

26. The multi-layer substrate of claim 23, wherein the first and second set of discrete spaced edges are triangular.

27. The multi-layer substrate of claim 26, further comprising a second conductor, and an additional air channel in each of the first and second spacer layers, wherein the second conductor is positioned so as to be coextensive with the additional air channels.

28. The multi-layer substrate of claim 26, further comprising a second conductor positioned on an opposite side of one of the first and second air channels from the first conductor, and a third spacer layer having a third air channel therein, wherein the third air channel is coextensive with the second conductor.

29. The multi-layer substrate of claim 26, further comprising a first spacer layer and a second spacer layer for covering the first and second set of discrete spaced edges but not the continuous main path.

30. The multi-layer substrate of claim 26, further comprising a first substrate layer covering the first spacer layer and a second substrate layer covering the second spacer layer.

31. The multi-layer substrate of claim 30, further comprising a first ground layer between the first substrate layer and the first spacer layer.

32. The multi-layer substrate of claim 31, further comprising a second ground layer between the second substrate layer and the second spacer layer.

33. A method for forming a suspended stripline within a multi-layer substrate, the method comprising the step of:
   forming a first substrate with a conductor on one side;
   etching the conductor into a stripline having a continuous main path and discrete spaced edges protruding from opposing edges of the continuous main path;
   applying a second substrate over the etched stripline;
   forming a first air channel in the first substrate substantially coextensive with the continuous main path of the stripline; and
   forming a second air channel in the second substrate substantially coextensive with the continuous main path of the stripline;
   wherein the first substrate and the second substrate at least partially cover the discrete spaced edges, but do not touch the continuous main path.

34. The method of claim 33, further comprising applying a third substrate layer to the first substrate layer thereby covering the first channel.

35. The method of claim 34, further comprising applying a fourth substrate layer to the second substrate thereby covering the second channel.

36. The method of claim 35, further comprising providing additional substrate layers and forming at least one additional stripline between two adjacent substrate layers.

37. The method of claim 33, wherein at least one of the steps of forming a channel comprises laser milling the channel.

* * * * *